April 29, 1952 K. NOWAK 2,594,485

CIRCUIT ORGANIZATION ADAPTED TO RECEIVE OR AMPLIFY ELECTRIC OSCILLATIONS

Filed April 2, 1949

INVENTOR
Karl Nowak
BY [signature]
ATTORNEY

Patented Apr. 29, 1952 2,594,485

UNITED STATES PATENT OFFICE 2,594,485

CIRCUIT ORGANIZATION ADAPTED TO RECEIVE OR AMPLIFY ELECTRIC OSCILLATIONS

Karl Nowak, Vienna, Austria

Application April 2, 1949, Serial No. 85,182
In Austria April 15, 1948

1 Claim. (Cl. 179—171)

My invention relates to a circular arrangement that is adapted to receive and amplify electric oscillations and in particular to a circuit in which there is both regenerative and degenerative coupling in an amplifier circuit.

The invention is concerned with means adapted to receive or amplify electrical oscillations comprising selective means in the plate circuit of an amplifier or electric discharge device and a grid circuit that is preferably aperiodic in which an electric oscillation or tuned circuit included in the plate circuit of the amplifier tube is in regenerative relationship. The basic idea of the invention is to feed incoming electric oscillations into the plate circuit the latter being coupled to the grid circuit in such manner as to produce amplification. This is preferably accomplished by dividing the coil in the plate oscillation circuit or tuned circuit into two separate uncoupled parts, one of which is coupled to the grid circuit so as to completely isolate the latter from the direct effect of the incoming energy or excitation.

By use of this invention the highest possible selectivity in the reception of or amplification of electrical oscillations is attained with a minimum of tuning devices. Circuit arrangements have been previously disclosed in which selectivity is insured and improved by means of an oscillation circuit having means for producing regeneration in the plate circuit of an amplifier tube in conjunction with a "reciprocal" degeneration scheme. However, these circuits are only capable of operating in conjunction with a single selective circuit having an aperiodic input.

My invention obviates this difficulty because, instead of introducing energy into the grid or input circuit of an amplifier, the amplifier or electron discharge device is excited by introduction of energy into a tuned or oscillatory circuit in a plate or output circuit, and amplification is achieved by the reaction of the tuned circuit just mentioned upon the grid circuit of the amplifier. The oscillation circuit into which the electrical energy is first introduced may be connected in series with a degenerative means, thereby affording an improvement in the selectivity which is termed "super-selectance." Furthermore, if the coil of the tuned circuit is split into 2 parts so that one portion thereof picks up the incoming oscillations while another portion serves to excite the grid of the tube, aperiodic reception is completely avoided even if the grid circuit itself is completely aperiodic.

Accordingly, it is an object of this invention to provide an improved highly selective amplification circuit in which electric oscillations are first introduced into a tuned circuit.

A further object of the invention is to provide an improved selective amplifier employing regenerative and degenerative circuits in which the electrical oscillations to be amplified are introduced into a tuned circuit that is coupled to an aperiodic grid or input circuit.

Another object of the invention is to provide a circuit arrangement in which a high degree of selectivity is achieved by the incorporation of a regenerative and degenerative means in series with the plate supply voltage of an amplifier.

It is an object of this invention to attain improved frequency selectivity in an amplifier circuit having non-coupled regenerative and degenerative means included in the input circuit.

A still further objective of the invention is to improve the frequency selectivity of an amplifier by including a tuned circuit in its plate circuit into part of which electric oscillations to be amplified are introduced, and another part of which is regeneratively coupled to the input of the amplifier so that the incoming signal does not directly affect the input circuit.

Another purposes of this invention is to provide an improved highly selective amplifier having a tuned circuit in the plate circuit of the amplifier that is regeneratively coupled to an aperiodic grid circuit and an isolated degenerative means that is also coupled to the grid circuit, there being no coupling between the tuned circuit and the degenerative circuit.

A still further purpose of the invention is to provide an improved highly selective amplifier that may be used in conjunction with substantially aperiodic radio frequency amplifiers.

It is an additional objective of the invention to provide an improved amplification circuit in which high frequency selectivity is achieved by including a tuned circuit in the output circuit of an amplifier that is regeneratively coupled to the input circuit of the amplifier and into which the electric oscillations to be amplified are introduced and including in the input circuit of the amplifier an impedance that serves to degenerate any oscillations present therein.

Figure 3:
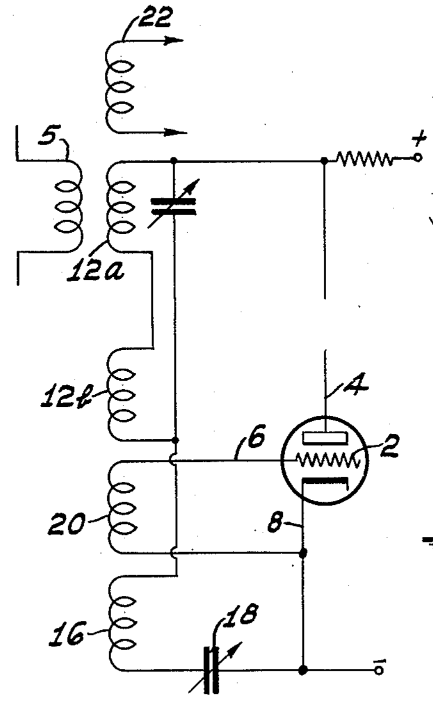
Figure 4:
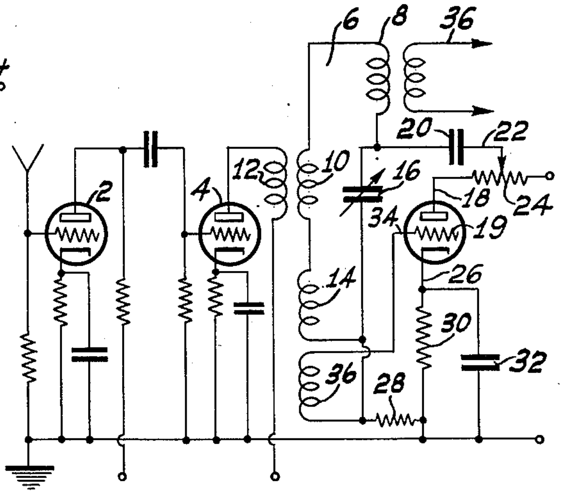

Figure 3 shows a circuit arrangement embodying the principles of the invention in which the winding of the tuned circuit is split into 2 uncoupled parts so as to isolate the grid circuit from the direct effect of the electrical oscillations that are introduced into the other winding of the tuned circuit and Figure 4 shows a receiver arrangement having 2 aperiodically coupled radio frequency coupled amplifier tubes in series with the circuit arrangement of the invention.

Figure 1:
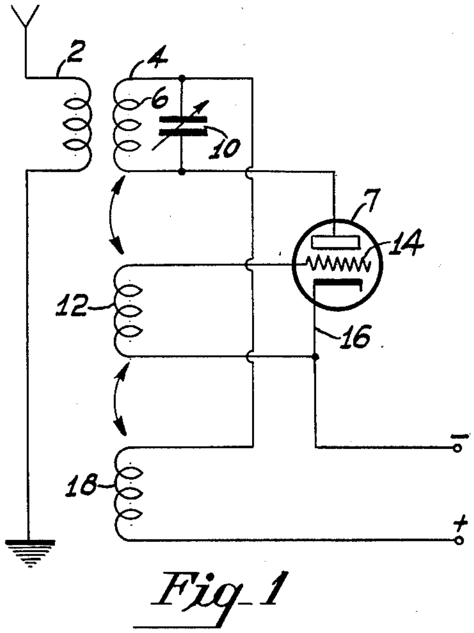
Figure 1 shows a circuit arrangement embodying the principles of the invention in which the regenerative means in series with the plate supply voltage.

Referring to Figure 1, there is shown an arrangement of the invention in which an input coil 2 serves to excite the inductance winding 4 of an oscillatory or tuned circuit 6 having a variable condenser 10 in parallel with the winding 4, said tuned circuit being included in the plate circuit of an amplifier 7. The grid or input circuit of the tube 7 comprises an untuned grid coil 12 that is not acted upon directly by the antenna, one end being connected to the grid 14 of tube 7 and the other being connected to the cathode 16. Reception of the signals introduced in the tuned circuit by the coil 2 is achieved by coupling the aperiodic grid coil 12 with the tuned circuit coil 7 in such manner as to produce regeneration thereby obtaining the same results as a circuit scheme in which the incoming oscillations or signals act directly upon the grid circuit in the first instance. However, in this circuit an advantage is obtained from the fact that by the use of a single tuned circuit 6 the arrangement is capable of producing high selectivity which has been called "super-selectance" and this is brought about by the cooperation of the positive regeneration and degeneration. In series with the oscillatory of tuned circuit 6 is connected an anti-tickler or degenerative coupling or degeneration coil 18 which acts upon the grid coil circuit 12 in a manner similar to the coil 7. Now, depending upon the operating frequency since the voltage division acting with respect to the tuned circuit 6 and decoupling or degeneration coil 18 shifts the mutual action upon the grid circuit produces a selectivity characteristic the sides or slopes of which in the presence of a substantial bandwidth turn out to be far steeper than that obtainable with a normal tuned circuit. Yet, by means of a construction such as is herein disclosed an aperiodic reception is precluded to a large degree even when the amount of regeneration and degeneration are reduced.

Figure 2:
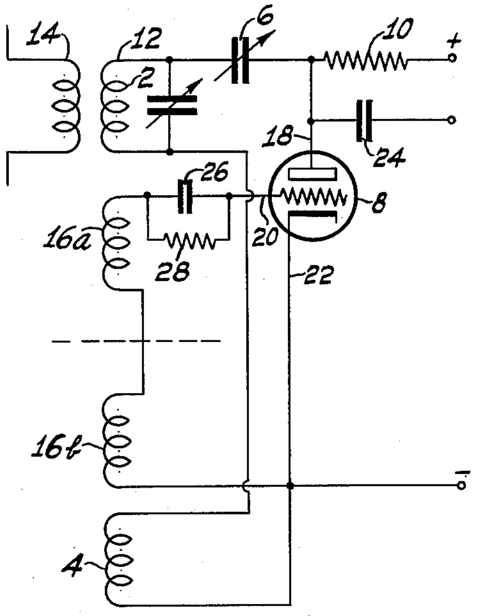
Figure 2 shows a circuit arrangement of the invention in which the degenerative and regenerative coupling are mutually exclusive.

Referring to Figure 2 there is shown a series scheme or circuit arrangement comprising a tuned circuit 2, a degeneration coil 4 and a variable series capacitor 6 forming a parallel branch with the amplifier 8 and the plate load resistor 10. In a manner similar to that described in connection with Figure 1 the tuned circuit inductance 12 is excited by electrical oscillations occurring in the primary coil or input winding 14. However, in this embodiment of the invention, the grid circuit coil is split into mutually uncoupled sections 16a and 16b that are coupled in a desired degree to coils 12 and 4. The amount of energy introduced into the parallel branch from the plate of the amplifier as well as the bandwidth of the amplifier 8 and its associated circuits are varied by means of a variable series capacitor 6 or an equivalent circuit arrangement. The tube 8 having a plate 18, grid 20 and cathode 22 is designed as a leak-resistor detector or audion in which the signal energy is delivered by the plate circuit via a coupling condenser or capacitor 24. The grid 20 is connected via a condenser 26 and resistor 28 connected in parallel to one end of the coil 16a and the remote end of coil 16b is connected to the cathode 22.

In Figure 3 there is illustrated a circuit embodying the principles of the invention in which an amplifier 2 having at least a plate 4, a grid 6 and a cathode 8 is connected in parallel with a tuned circuit 10 that comprises mutually uncoupled windings 12a and 12b in parallel with the variable condenser 14 and a decoupling or degeneration coil 16 that is connected via variable condenser 18 to the cathode 8. In this arrangement the coil 12b is regeneratively coupled to the substantially aperiodic grid coil 20 connected between the grid 16 and the cathode 8 and the coil 16 is degeneratively coupled thereto in a manner similar to the circuit discussed above. An input coil 5 introduces signal energy into winding 12a, and the output energy is obtained from an output coil 22 that is coupled to coil 12a.

Another arrangement embodying the basic idea of the invention is illustrated in Figure 4 in which there is shown a receiver arrangement comprising two aperiodically coupled radio frequency amplifiers 2 and 4 connected in series with a circuit arrangement embodying the invention. In this embodiment of the invention a parallel tuned circuit 6 having an output coil 8 coupled to a load coil 9, a coil 10 coupled to the input coil 12 of the last stage of radio frequency amplification and a regenerative coil 14, connected in parallel with a variable condenser 16 is coupled to the plate 18 of amplifier 19 via coupling condenser 20, variable contact 22 and a portion of the plate loading resistor 24, and its opposite end is connected to the cathode 26 via a degenerative impedance which may be a resistor 28 and cathode bias resistor 30, and cathode bias resistor 30 is in parallel with condenser 32. The grid 34 is connected to one end of aperiodic grid excitation coil 36 the other end of said coil being connected to resistor 28. It is therefore seen that the inductance in tuned circuit 6 is divided into 3 portions, portion 10 being excited from an input winding 12, portion 14 acting upon the grid coil 36, while portion 8 excites load coil 39 which, for example, may influence a diode path. In lieu of a degenerative coil as described above, there is employed a degenerative scheme or circuit arrangement comprising the ohmic resistor 28 connected in series with the tuned circuit 6. The amount of regeneration and bandwidth are regulated from the tap 22 on the plate resistor 24. The coils 12 and 10 and the coils 14 and 36 as well as 8 and 9 are wound upon a common core and are so disposed that a desired magnetic coupling is maintained between each pair.

The invention discloses ways and means of designing a receiver apparatus having high gain that comprises only a single tuned circuit and at the same time possesses a high degree of selectivity. If radio frequency amplification is provided, the arrangement herein disclosed is preferably connected to the output of the last stage or otherwise in the input stage of a leak resistor detector or audion. It may prove advantageous to use a diode path if such is provided with an amplitude threshold operating with a biasing voltage so that it will be responsive only to incoming signal amplitudes of certain predetermined level or value, for in this manner the receiving qualities may be still further improved in combination and co-action with the circuit arrangement of the invention.

A few typical construction details for arrangement of the kind illustrated in Figure 3 as follows: coils 5, 12a and 22 are wound upon a common iron core; coils 12b, 20 and 16 are wound upon a separate iron core, coils 12b and 16 also comprising 5 turns each. However, if a marked regeneration effect is especially desired, then 50 turns may be used in coil 12b and the coils 20 and 16 may contain 20 turns each but if, on the contrary, it is desired to produce a steepness in the flanks or slopes of the selectivity curve without any marked regeneration, then the coils 12b and 20 may have 50 turns each and coil 16 may have 100 turns. The coupling capacitor 18 may be in the neighborhood of 500 to 1,000 cm. for successful results. On the other hand, in the circuit shown in Figure 4, the coupling capacitor 20 may be of the order of 1,000 cm. or over. These circuit parameters are provided for purposes of illustration and are not intended to be critical or limiting values.

Having described my invention I claim:

An amplifier arrangement comprising in combination an amplifier having at least a plate, a grid and a cathode, a parallel tuned circuit having inductive and capacitative branches, one end of said tuned circuit being coupled to said plate, a degenerative impedance connected between the other end of said tuned circuit and said cathode, said inductive branch being formed of three uncoupled coils, a signal input coil coupled to one of said coils in the inductive branch of said tuned circuit, a load coil coupled to another of the coils in said inductive branch, a coil coupled between said other end of said tuned circuit and said grid, said latter coil being regeneratively coupled to a third coil in the inductive branch of said tuned circuit.

KARL NOWAK.

REFERENCES CITED

The following references are of record in the file of this patent:

UNITED STATES PATENTS

| Number | Name | Date |
|---|---|---|
| 2,162,470 | Kautter | June 13, 1939 |
| 2,173,427 | Scott | Sept. 19, 1939 |
| 2,197,239 | Farrington | Apr. 16, 1940 |
| 2,268,672 | Plebanski | Jan. 6, 1942 |
| 2,315,043 | Boucke | Mar. 30, 1943 |